(12) United States Patent
Tai et al.

(10) Patent No.: US 6,703,301 B2
(45) Date of Patent: Mar. 9, 2004

(54) METHOD OF PREVENTING TUNGSTEN PLUGS FROM CORROSION

(75) Inventors: Chen Chung Tai, Hsinchu (TW); Tung Ke-Wei, Hsinchu (TW); Chung Chia Chi, Hsinchu (TW); Lee Chun Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 81 days.

(21) Appl. No.: 10/132,286

(22) Filed: Apr. 26, 2002

(65) Prior Publication Data

US 2003/0203625 A1 Oct. 30, 2003

(51) Int. Cl.⁷ .......................................... H01L 21/4763
(52) U.S. Cl. ....................... 438/620; 438/710
(58) Field of Search .................. 438/620, 710

(56) References Cited

U.S. PATENT DOCUMENTS

| | | | |
|---|---|---|---|
| 5,893,756 A | 4/1999 | Berman et al. | 438/692 |
| 6,068,879 A | 5/2000 | Pasch | 427/97 |
| 6,103,615 A | 8/2000 | Sugasawara et al. | 438/622 |
| 6,117,795 A | 9/2000 | Pasch | 438/745 |
| 6,251,568 B1 | 6/2001 | Hsia et al. | 430/325 |
| 6,277,742 B1 | 8/2001 | Wang et al. | 438/672 |
| 6,462,005 B1 * | 10/2002 | Gotoh et al. | 510/176 |
| 6,465,358 B1 * | 10/2002 | Nashner et al. | 438/700 |
| 2002/0001962 A1 * | 1/2002 | Yokoi | 438/710 |

\* cited by examiner

*Primary Examiner*—Carl Whitehead, Jr.
*Assistant Examiner*—David S Blum
(74) *Attorney, Agent, or Firm*—Finnegan, Henderson, Farabow, Garrett & Dunner, L.L.P.

(57) ABSTRACT

Tungsten plugs are prevented from corrosion, during fabrication of semiconductor devices, where the tungsten plug is formed in a substrate and coupled with a wire formed on the substrate. The substrate is dipped into a non-ionic benign solvent which substantially discharges the charges accumulated on a surface of the wire, followed by a rinsing process to clean the surface of the wire and then spin-drying.

10 Claims, 7 Drawing Sheets

METHOD OF PREVENTING TUNGSTEN PLUGS FROM CORROSION

DESCRIPTION OF THE INVENTION

1. Field of the Invention

The present invention relates to a method of preventing the corrosion of tungsten plugs during semiconductor device fabrication processes.

2. Background of the Invention

As semiconductor device dimensions shrink, it has become necessary to conserve area on the semiconductor wafer surface, especially during the real-estate consuming process of fabricating several stacked layers of interconnect wires (metallization levels). In many ways, device density on a chip is now interconnect-limited. In previous years, when device dimensions (and hence interconnect wires) were larger, wires usually completely covered the underlying tungsten (W) plugs (referred to hereinafter as either a "tungsten plug" or a "W plug") at their contact point, and corrosion of the tungsten was a concern only when misalignment of an optical projection lithography stepper resulted in a patterned wire layer not aligned squarely over the top of a given W plug. Now, because of ever-shrinking device dimensions (and the need for tighter control over interconnect wire size), wire layers are often purposefully formed so that they do not completely cover an underlying W plug. As such, the corrosion of W plugs and the overlying wires are still a concern in the fabrication process.

Generally, after forming a W plug, a wire is formed to couple with the W plug. This wire material has typically been Al-(0.5 wt %–1.5 wt %)Cu. Although in the last few years, as device dimensions shrink below the 0.18 μm design rule, Cu wiring materials have been replacing Al-based alloys as the multi-level interconnect material of choice.

Figure 1:
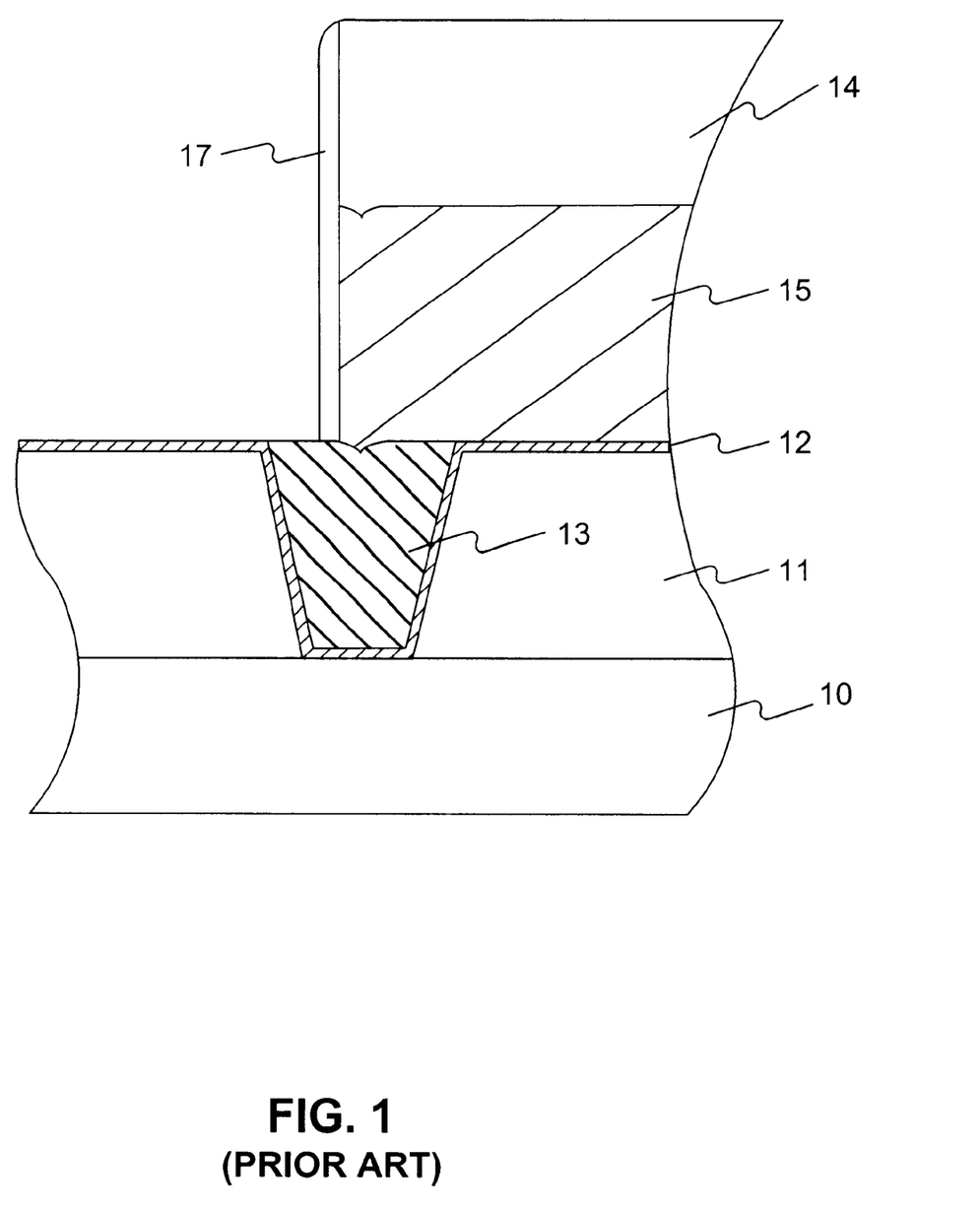
FIG. 1 is a cross-sectional view (not to scale) of a partially-processed semiconductor device showing a tungsten (W) plug, metal wire, and polymeric resist material on a semiconductor substrate, according to the prior art.

FIG. 1 is a cross-sectional view (not to scale) of a partially-processed semiconductor device according to the prior art, showing a substrate 10, interlevel dielectric material 11, a "glue layer" or adhesion layer 12 comprising TiN, TiW, or other barrier material, tungsten (W) plug 13, polymeric resist (photoresist) material 14 for pattern definition, metal wire 15, and a polymeric residue (etch byproduct) 17. The interconnect wire 15, as shown, does not completely cover the underlying W plug 13. This patterned wire 15 may be accidentally misaligned over the W plug 13, or purposefully formed to cover only part of the W plug 13 (to conserve chip area). It will be understood by those skilled in the art that the cross-sectional views presented in all the drawings omit several known components of a semiconductor device/integrated circuit (IC) for the purposes of clarity.

Figure 2:
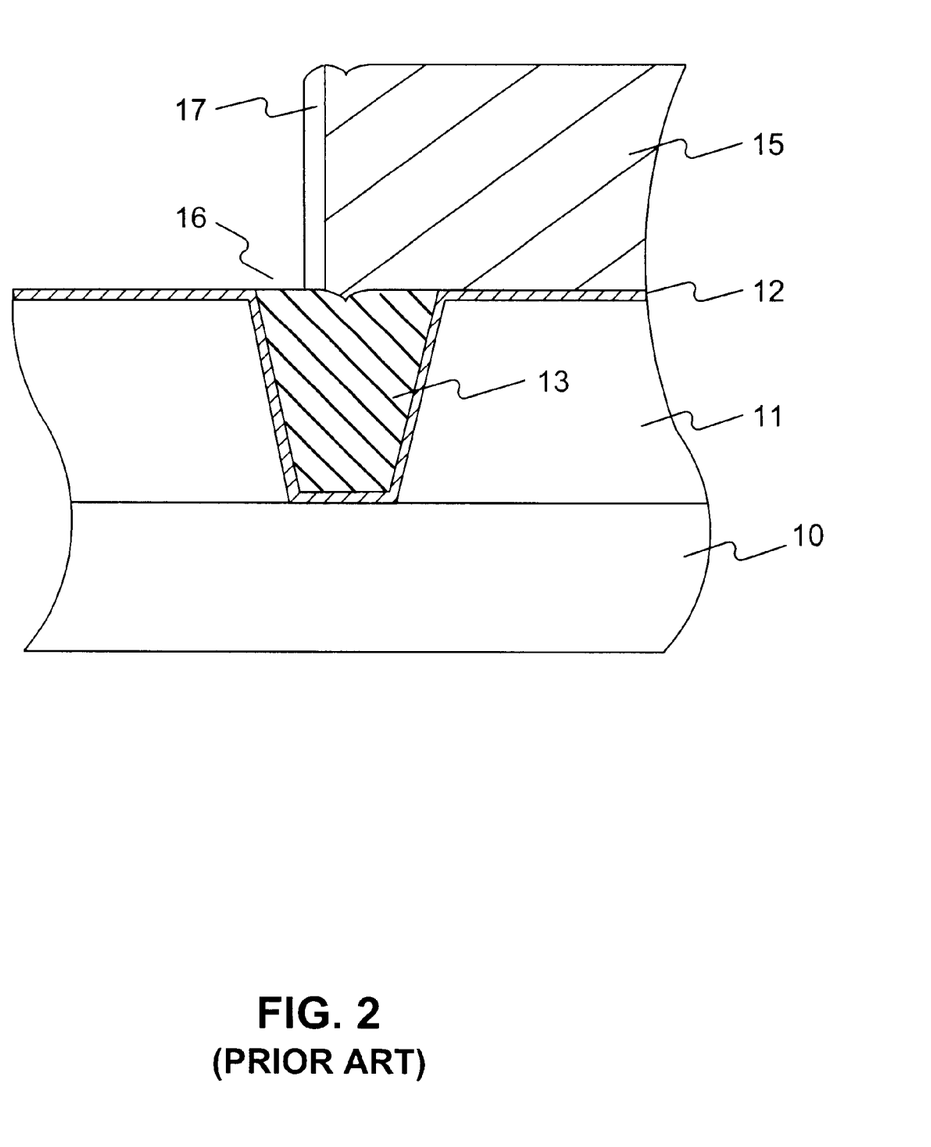
FIG. 2 is a cross-sectional view (not to scale) of a partially-processed semiconductor device according to FIG. 1, wherein some of the polymeric resist material remains as polymeric residue after a dry etching step.

FIG. 2 is a cross-sectional view (not to scale) of a partially-processed semiconductor device according to FIG. 1, showing some polymeric material 14 (FIG. 1) (which has been generated from dry etching) remaining as polymeric residue 17 after a dry etching step. The exposed portion 16 of W plug 13 is evident adjacent to the polymeric residue 17. While performing this oxygen plasma etching process to ash the photoresist 14 and pattern interconnect wire 15, some residual photoresist or other polymeric residue 17 is inevitably left behind and remains adhered to the side surfaces of patterned wire 15 and photoresist 14. This polymeric residue 17 must be removed before the fabrication process can continue. The oxygen plasma etching step described above is typically performed to remove photoresist material 14, followed by a wet-cleaning process utilizing a stripping solution (e.g. EKC-265™ from EKC Technology Inc. of Hayward, Calif.) with a conventional pH of about 10–12 to remove polymeric residue 17.

In a case, such as that described above, where interconnect wire 15 is misaligned over W plug 13, or in a case where interconnect wire 15 is purposefully patterned to incompletely cover W plug 13, a portion 16 of the W plug 13 surface is exposed during subsequent processing steps.

Figure 3:
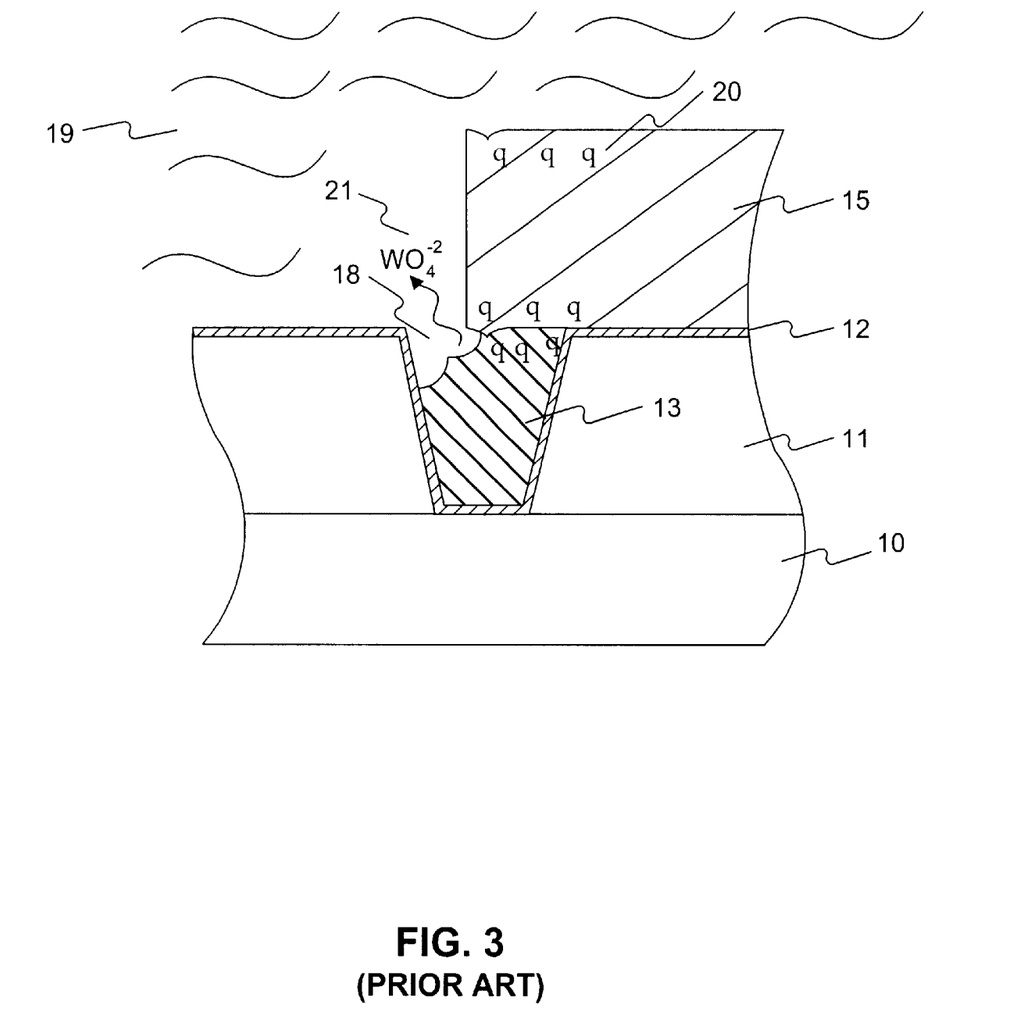
FIG. 3 is a cross-sectional view (not to scale) of a partially-processed semiconductor device according to the prior art, showing tungsten (W) plug corrosion during the standard wet stripping process used to remove remaining polymeric residue from the wire.

As shown in FIG. 3 (a cross-sectional view (not to scale) of a partially-processed semiconductor device according to the prior art), W plug 13 corrosion occurs during the standard wet-stripping process used to remove remaining polymeric residue 17 from wire 15.

While the wet-cleaning process is performed with stripping solution 19 to remove polymeric residue 17 on the sides of patterned metal wire 15, the exposed portion of W plug 13 is corroded by stripping solution 19 and a hole 18 is formed in W plug 13. This tungsten corrosion is caused by charges ("q") 20 accumulated on the surface of interconnect wire 15 either while performing the interconnect wire 15 etching process to pattern said wire 15, or when oxygen plasma ashing the photoresist 14. The charged wire and W plug 13 exhibit a large electrical potential between them (the two dissimilar metals have different electrochemical potentials and essentially form a galvanic couple). As a result, the exposed tungsten is oxidized to an ionic state 21 ($WO_4^{-2}$, for example) by the stripping solution 19, which has a pH value conventionally from 10 to 12. The exposed tungsten is stripped from the surface of W plug 13 during this wet-cleaning process, resulting in the abovementioned hole 18.

Figure 4:
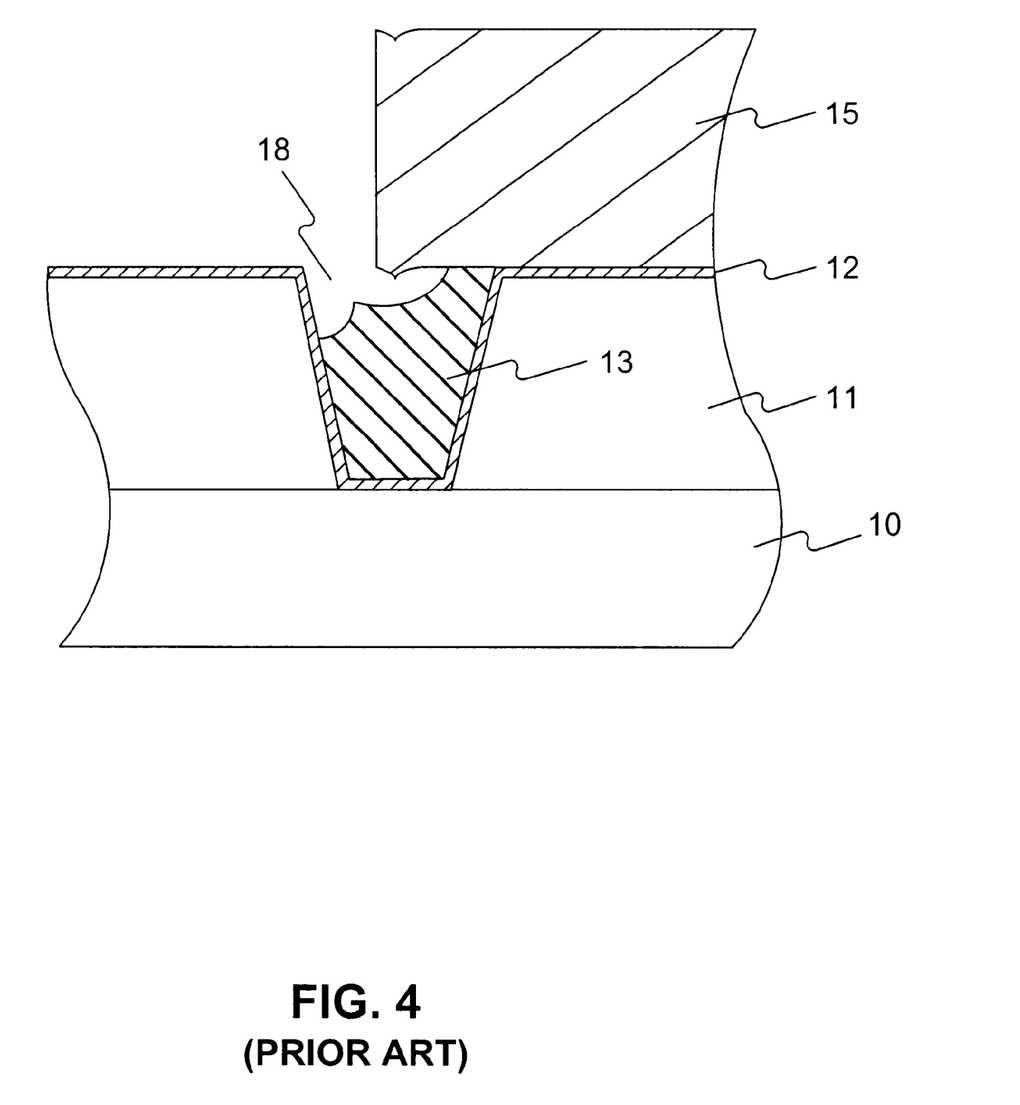
FIG. 4 is a cross-sectional view (not to scale) of a partially-processed semiconductor device according to the prior art, showing tungsten (W) plug corrosion and reduced contact area after the standard wet stripping process.

FIG. 4 is a cross-sectional view (not to scale) of a partially-processed semiconductor device according to the prior art, showing the W plug 13 corrosion hole 18 after the standard wet-stripping process discussed above and illustrated in FIG. 3. Because the area of contact between W plug 13 and patterned metal wire 15 is reduced by corrosion of W plug 13, electrical resistance is increased in the wiring lines and this inevitably leads to catastrophic failure of the integrated circuit (IC).

The conventional prior art solution to the abovementioned corrosion problem is to dip a partially-processed substrate into a neutral ionic solution (e.g. electrolyte) or deionized water for several hours, and then to perform the wet cleaning process with the stripping solution. By dipping the substrate into a neutral ionic solution, the charges (q) accumulated on the wire surface are effectively discharged. Nevertheless, while this protects W plug 13 from electro-galvanic corrosion, interconnect wire 15 on top of W plug 13 is instead corroded by the neutral ionic solution (i.e. the metal in wiring 15 reacts with the salts/electrolytes in the neutral ionic solution). As wire dimensions continue to shrink, preventing corrosion of the wire is important along with preventing corrosion of W plug 13, for reasons already mentioned. Furthermore, after the substrate dipping step, a separate rinse-dry step is required for this method to remove any residual solution (i.e. salts/electrolytes) from the substrate.

Therefore, the present invention provides a method of preventing W plugs and metal wires from corrosion during semiconductor device fabrication. According to the present invention, the method comprises steps of providing a W plug formed in a substrate and coupled with a wire formed on the substrate. The substrate is then dipped into a non-ionic benign solvent, such as pure isopropyl alcohol (IPA) or pure N-methyl pyrrolidone (NMP), and a rinse process is performed to clean a surface of the wire. Then, the substrate is spin-dried and a conventional wet-stripping process is performed.

This invention uses the IPA or NMP solvents to discharge the electrical charges (q) accumulated on the wire, thereby preventing the W plugs from electro-galvanic corrosion. Once the charge accumulated on the wire is discharged, there is no longer a large electrical potential generated between the W plug and the wire during the subsequent wet-cleaning step. As a result, the exposed tungsten is unlikely to oxidize and the W plugs are protected from corrosion. Furthermore, the IPA and NMP solvents do not chemically attack the interconnect wire patterned over the W plug, and consequently wire corrosion is also prevented.

Since IPA and NMP solvents are commonly used in an inter-medium rinse process performed after oxygen plasma etching and wet cleaning (e.g. with EKC-265™) and before a Quick Dump Rinse (QDR) process, pure IPA and pure NMP solvents are readily available from a general fabrication facility. In addition, the duration of dipping the substrate into the pure IPA or pure NMP solvent is up to only a few minutes, which is a substantially shorter duration than the prior art neutral ionic solution dipping process. Therefore, the process according to an aspect of the present invention simplifies the processing sequence of the semiconductor metallization layers and is cost effective. Efficiency can be improved and processing time reduced without the need to change fabrication equipment or to introduce additional potential contaminants into the production line.

Furthermore, using the IPA or NMP solvents to discharge the electrical charge accumulation on the wire prevents the W plugs from electro-galvanic corrosion, since the IPA or NMP solvents are chemically compatible with wet cleaning processes (e.g. with EKC-265™). A direct integrated IPA or NMP discharge step before the wet cleaning is possible, which makes the process simple and more cost effective.

SUMMARY OF THE INVENTION

The present invention provides a method for preventing the corrosion of W plugs and patterned metal layers when polymeric residue is removed with a wet-stripping solution during manufacture of semiconductor devices.

In accordance with an embodiment of the present invention, a method of preventing tungsten plugs from corrosion comprises providing a tungsten plug formed in a substrate and coupled with a wire formed on the substrate, dipping the substrate into a non-ionic benign solvent, performing a rinsing process to clean a surface of the wire, and performing a spin-drying step. The substrate is dipped in the non-ionic benign solvent, such as IPA or NMP, before the standard wet stripping process is performed. The non-ionic benign solvent substantially discharges a net charge accumulated on a surface of the wire during fabrication of a semiconductor device. The substrate dipping time can vary from about 1 second to 5 minutes.

Additional features and advantages of the invention will be set forth in part in the description which follows, and in part will be obvious from the description, or may be learned by practice of the invention.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DETAILED DESCRIPTION OF THE PREFERRED EMBODIMENTS OF THE INVENTION

Reference will now be made in detail to the present embodiments of the invention, examples of which are illustrated in the accompanying drawings. Wherever possible, the same reference numbers will be used throughout the drawings to refer to the same or like parts. It will be understood by those in the art that the cross-sectional view presented in the drawings omits several components of a semiconductor device/integrated circuit (IC) for the purposes of clarity and to simplify the diagrams.

FIGS. 1 through 4, as discussed in the previous section, broadly illustrate the problems with W plug corrosion during semiconductor device processing.

Figure 5:
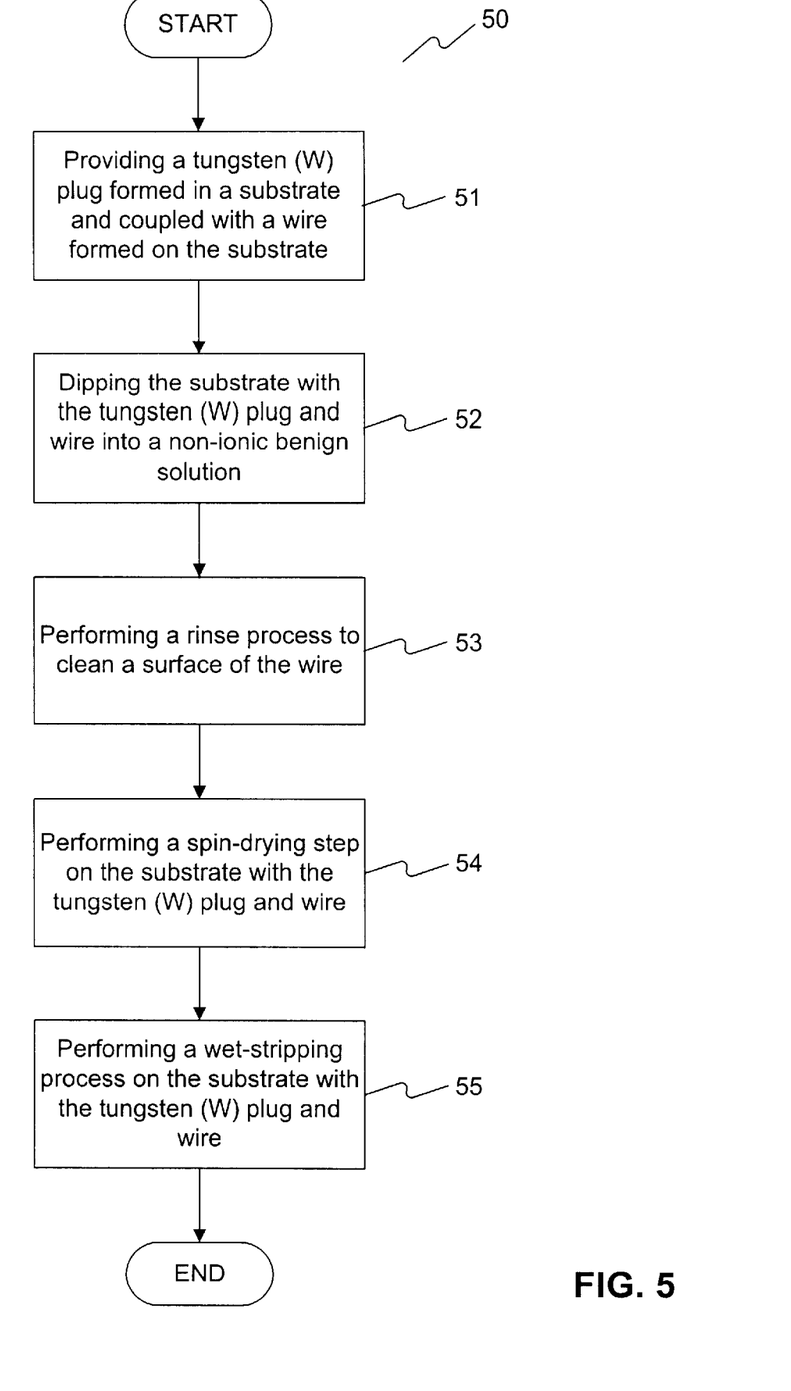
FIG. 5 is a process flow diagram of a process for preventing corrosion of tungsten (W) plugs and metal wires according to the present invention.

FIG. 5 shows a process flow diagram 50 illustrating the process for preventing corrosion of W plugs according to an embodiment of the present invention. Process 50 begins at step 51, which includes providing a W plug formed in a substrate and coupled with a wire formed on the substrate. The wire formed in step 51 may be purposefully formed so that it does not completely cover the underlying W plug, which is now typical for 0.18 $\mu$m design rule (and smaller) processing technologies.

Next, a step 52 includes dipping the substrate with the W plug and wire into a non-ionic benign solution. According to an embodiment of the present invention, the substrate with the W plug and wire could be dipped into either IPA or NMP. One skilled in the art would easily recognize that the non-ionic benign solution would be at ambient temperature (e.g. 298K) in normal laboratory conditions. The performance of step 52 substantially eliminates the charges accumulated on the surface of the wire when the wire was patterned and the photoresist removed by oxygen plasma etching. Step 52 provides an additional advantage over the prior art methods in that it does not corrode the patterned wire while reducing the charges accumulated on its surface.

Thus, use of either IPA or NMP in step 52 prevents W plug corrosion while also preventing corrosion of the overlying patterned metal wire.

Next, step 53 includes performing a rinse process to clean a surface of the wire after dipping step 52. After rinse step 53, step 54 includes performing a spin-drying step on the substrate with the W plug and patterned wire.

Finally, step 55 includes performing a wet-stripping process on the substrate with the W plug and the patterned wire. Step 55 avoids damage to the W plug or to the patterned wire, because any charges accumulated on the wire surface during oxygen plasma etching were substantially eliminated by step 52. Thus, the exposed portion of the W plug is not oxidized and stripped, and the metal wire is not corroded during step 55.

Figure 6:
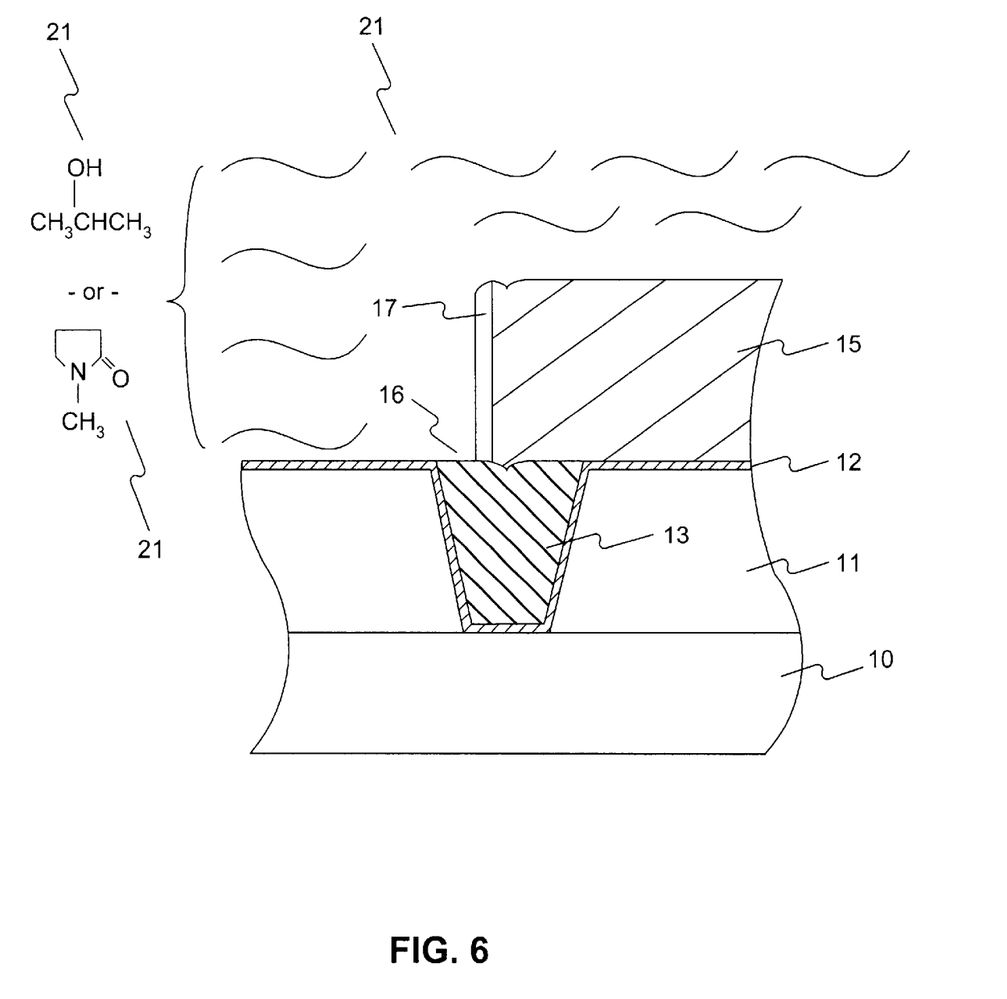
FIG. 6 is a cross-sectional view (not to scale) of a partially-processed semiconductor device, showing the substrate dipping process according to the present invention.

FIG. 6 is a cross-sectional view (not to scale) of a partially-processed semiconductor device, showing the substrate dipping process of step 52 in FIG. 5 of the present invention. The non-ionic benign solution 21 is illustrated by chemical formula (IPA or NMP) as it is applied to neutralize charges accumulated on the surface of patterned wire 15. Note the presence of polymer residue 17, which will be subsequently removed by the wet-stripping process.

Figure 7:
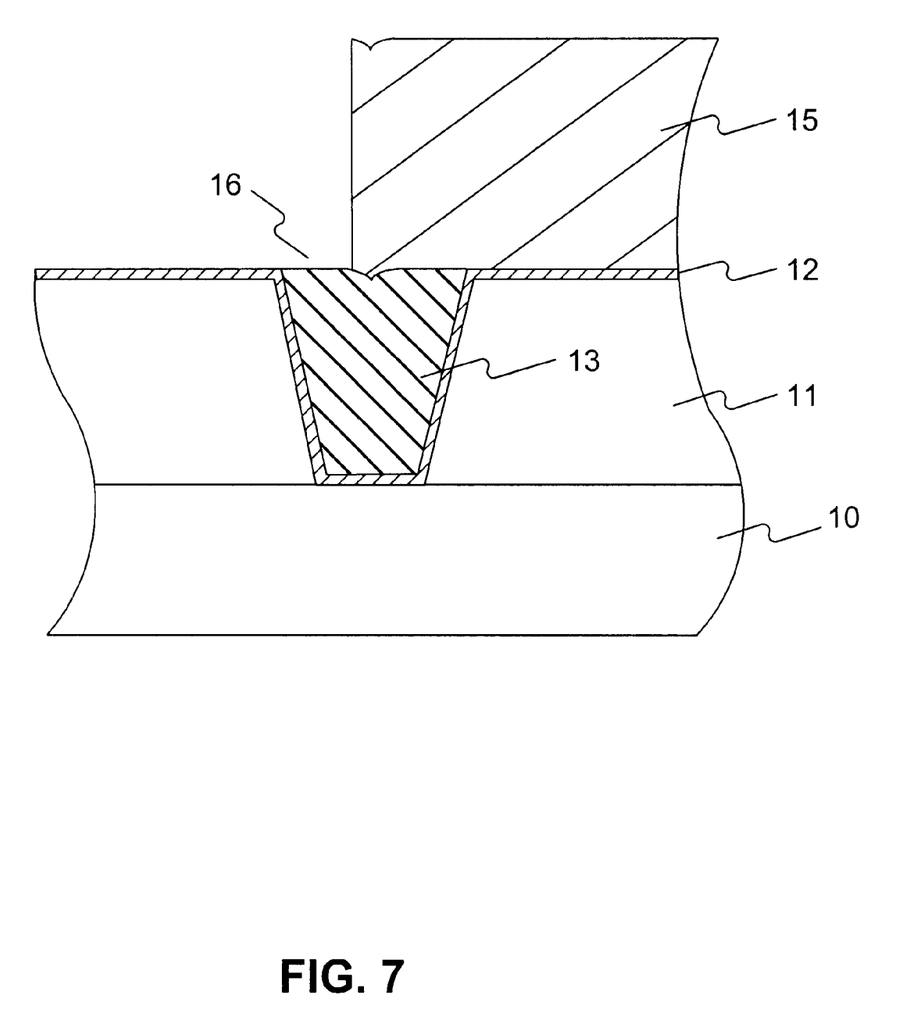
FIG. 7 is a cross-sectional view (not to scale) of a partially-processed semiconductor device, after the dipping process according to the present invention, wherein the polymeric resist material has been removed and the tungsten (W) plug and patterned wire have not been corroded, according to the present invention.

FIG. 7 is a cross-sectional view (not to scale) of a partially-processed semiconductor device according to FIG. 6, after dipping process step 52 (FIG. 5), wherein polymeric residue 17 has been removed and W plug 13 and patterned wire 15 have not been corroded. Thus, the present invention utilizes materials already available and in use on semiconductor device fabrication lines to eliminate a significant problem plaguing multilevel wire metallization processing steps. The use of these materials, such as IPA and NMP, does not require additional processing steps and is easily accommodated by a rinsing step 53 (FIG. 5). The present invention prevents corrosion of the W plug and the patterned metal wire while not substantially increasing the overall processing time or costs.

Although the foregoing invention has been described in some detail for the purposes of clarity of understanding, it will be apparent that certain changes and modifications may be practiced within the scope of the appended claims. For example, while the specification describes performing the dipping step for charge neutralization, this step could be performed during subsequent processing steps (e.g. on different metallization layers) to prevent corrosion due to additional charge accumulation on wire surfaces. In addition, rinse process step 53 and spin-drying step 54 could be eliminated if the fabrication tool has already been prepared for the discharge purpose. This is because the non-ionic benign solution, e.g. IPA and NMP, is compatible with wet strip solvents like EKC-265™, without the need for the rinse process and spin-drying steps.

Furthermore, the present invention is not limited to the use of Al-based interconnect wiring technologies. Cu wiring has been mentioned above, in addition to Al(0.5 wt %–1.5 wt %)Cu, and it will be apparent to those skilled in the art that the present invention prevents corrosion of W plugs and patterned Cu wires. With the advent of Cu wiring, W plugs are still used at the first metallization level directly contacting the active regions in semiconductor devices. W plugs are used in order to prevent "Cu poisoning" due to copper's high diffusivity into some materials. Prevention of W plug corrosion is useful at the first metallization level to prevent pathways for Cu to diffuse into an active region of a semiconductor device. Furthermore, since Cu does not grow a protective oxide film like Al, it corrodes much more readily. Prevention of this corrosion is also advantageous for semiconductor device processing using Cu wiring.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of preventing tungsten plugs from corrosion, comprising:

provinding a tungsten plug formed in a substrate and coupled with a wire formed on the substrate;

dipping the substrate into a non-ionic benign solvent;

performing a rinsing process to clean a surface of the wire; and performing a spin-drying step.

2. The method of claim 1, wherein the non-ionic benign solvent substantially discharges any net charge accumulated on a surface of the wire.

3. The method of claim 1, wherein the step of dipping the substrate into the non-ionic benign solvent is performed before a wet-stripping process.

4. The method of claim 1, wherein the non-ionic benign solvent is a pure isopropyl alcohol.

5. The method of claim 1, wherein the non-ionic benign solvent is a pure N-methyl pyrrolidone.

6. The method of claim 1, wherein the dipping step is performed for a duration in the range of about 1 to 300 seconds.

7. The method of claim 1, wherein the rinsing process step is performed for a duration in the range of about 5 to 15 minutes.

8. The method of claim 1, wherein the wire is an Al-based alloy.

9. The method of claim 1, wherein the wire is a Cu or Cu-based alloy.

10. The method of claim 1, wherein dipping the substrate is performed in ambient temperature.

* * * * *